United States Patent
Miller et al.

(10) Patent No.: US 7,324,561 B1
(45) Date of Patent: Jan. 29, 2008

(54) SYSTEMS AND METHODS FOR GENERATING AN OUTPUT OSCILLATION SIGNAL WITH LOW JITTER

(75) Inventors: Richard Miller, Los Altos, CA (US); Gabriel-Gheorghe Dumitrescu, San Jose, CA (US); Ion E. Opris, San Jose, CA (US)

(73) Assignee: Silicon Clocks Inc., Oakland, CA (US)

( * ) Notice: Subject to any disclaimer, the term of this patent is extended or adjusted under 35 U.S.C. 154(b) by 782 days.

(21) Appl. No.: 10/857,054

(22) Filed: May 28, 2004

Related U.S. Application Data (60) Provisional application No. 60/478,628, filed on Jun. 13, 2003.

(51) Int. Cl.
*H04J 3/06* (2006.01)
(52) U.S. Cl. .................. 370/516; 331/182; 375/371
(58) Field of Classification Search ............... None
See application file for complete search history.

(56) References Cited

U.S. PATENT DOCUMENTS

| | | |
|---|---|---|
| 3,223,928 A | 12/1965 | Fayman |
| 3,281,648 A | 10/1966 | Collins |
| 3,378,769 A | 4/1968 | Luzzatto |
| 4,121,163 A | 10/1978 | Fikart |
| 4,297,654 A | 10/1981 | Goerth |
| 4,320,531 A | 3/1982 | Dimon |
| 5,047,734 A | 9/1991 | Newell et al. |
| 5,077,546 A | 12/1991 | Carfi et al. |
| 5,113,153 A | 5/1992 | Soyuer |
| 5,113,156 A | 5/1992 | Mahabadi et al. |
| 5,396,659 A | 3/1995 | Kimura |
| 5,463,356 A | 10/1995 | Palmer |
| 5,552,734 A | 9/1996 | Kimura |
| 5,661,424 A | 8/1997 | Tang |
| 5,878,332 A | 3/1999 | Wang et al. |
| 5,912,594 A | 6/1999 | Burkhard |
| 5,959,505 A | 9/1999 | Ushiyama |
| 6,052,036 A | 4/2000 | Enström et al. |

(Continued)

OTHER PUBLICATIONS

Magarit et al, A Low-Noise, Low-Power VCO with Automatic Amplitude Control for Wireless Applications, IEEE, pp. 761-771, Jun. 1999.*

(Continued)

*Primary Examiner*—Frank Duong
(74) *Attorney, Agent, or Firm*—Carr & Ferrell LLP (57) ABSTRACT

A circuit for generating an output oscillation signal with low jitter includes an oscillator to generate an oscillation signal at an initial frequency based upon a control input to vary an amplitude of the oscillation signal. A first frequency multiplier multiplies the oscillation signal to result in a first signal with first frequency and first undesired frequency components. A filter minimizes the first undesired frequency components of the first signal. A second frequency multiplier multiplies the first signal to result in the output oscillation signal with second frequency and second undesired frequency components. A second feedback circuit compares a predetermined range and at least one of the first signal and the output oscillation signal to result in a reference value. A first feedback circuit varies the control input based upon a comparison between the reference value and the amplitude of the oscillation signal to minimize the second undesired frequency components.

28 Claims, 9 Drawing Sheets

U.S. PATENT DOCUMENTS

| | | |
|---|---|---|
| 6,064,277 A | 5/2000 | Gilbert |
| 6,100,731 A | 8/2000 | Otaka |
| 6,121,849 A | 9/2000 | McCollough et al. |
| 6,137,375 A | 10/2000 | Li |
| 6,252,438 B1 | 6/2001 | Sasaki |
| 6,278,338 B1 * | 8/2001 | Jansson ............... 331/109 |
| 6,313,712 B1 | 11/2001 | Mourant et al. |
| 6,333,679 B1 | 12/2001 | Eriksson |
| 6,337,604 B1 | 1/2002 | Clarke |
| 6,340,920 B1 | 1/2002 | Tseng |
| 6,385,266 B1 | 5/2002 | Haberle et al. |
| 6,396,659 B1 | 5/2002 | Nakayama |
| 6,456,143 B2 | 9/2002 | Masumoto et al. |
| 6,466,064 B2 | 10/2002 | Kurogouchi et al. |
| 6,542,042 B1 | 4/2003 | Atkinson |
| 6,591,091 B1 | 7/2003 | Vorenkamp et al. |
| 6,696,898 B1 | 2/2004 | Ward et al. |
| 7,098,753 B1 * | 8/2006 | Dumitrescu et al. ........ 331/182 |
| 2001/0008430 A1 | 7/2001 | Carr et al. |
| 2001/0043109 A1 | 11/2001 | Masumoto et al. |
| 2001/0054919 A1 | 12/2001 | Wang |
| 2002/0125924 A1 | 9/2002 | Kurogouchi et al. |
| 2002/0183018 A1 | 12/2002 | Veit |
| 2003/0025537 A1 | 2/2003 | Laws |
| 2003/0119466 A1 | 6/2003 | Goldman |
| 2004/0056728 A1 | 3/2004 | Dent et al. |
| 2004/0140857 A1 | 7/2004 | Ogiso |
| 2005/0083140 A1 | 4/2005 | Hashimoto |

OTHER PUBLICATIONS

Zanchi et al, Impact of AAC Design on Phase Noise Performance of VCOs, IEEE, pp. 537-547, Jun. 2001.*

Wenzel Associates, Inc., "VCXOs—Voltage-Controlled Crystal Oscillators," Jun. 2003, located at http://www.wenzel.com/documents/vcxo.html.

Chattopadhyay, G. et al., "Frequency Multiplier Response to Spurious Signals and Its Effect on Local Oscillator Systems in Millimeter and Submillimeter Wavelengths," Proceedings of the SPIE, Aug. 25-28, 2002.

Shin, H. et al., "A 1.8-V 6/9-GHz Switchable Dual-Band Quadrature LC VCO in SiGe BiCMOS Technology," Proceedings of the 2002 IEEE Radio Frequency Integrated Circuits Symposium, Jun. 2-4, 2002.

* cited by examiner

SYSTEMS AND METHODS FOR GENERATING AN OUTPUT OSCILLATION SIGNAL WITH LOW JITTER

CROSS-REFERENCE TO RELATED APPLICATIONS

This application claims the benefit of Provisional Patent Application Ser. No. 60/478,628, filed Jun. 13, 2003, entitled "A Semiconductor Integrated Circuit for Frequency Multiplication," which is hereby incorporated by reference. This application is also related to co-pending U.S. patent application Ser. No. 10/856,202, filed May 28, 2004, entitled "Oscillator with Variable Reference," now U.S. Pat. No. 7,098,753 issued on Aug. 29, 2006, which is hereby incorporated by reference. This application is also related to co-pending U.S. patent application Ser. No. 10/857,241, filed May 28, 2004, entitled "Systems and Methods for Tuning the Operating Frequency of a Crystal," now abandoned, which is hereby incorporated by reference.

BACKGROUND OF THE INVENTION

1. Field of the Invention

This invention relates generally to integrated circuits, and more specifically to systems and methods for generating an output oscillation signal with low jitter.

2. Description of the Background Art

As digital communications such as Synchronous Optical Network ("SONET") and Gigabit-Ethernet strive for ever-higher data communication rates, clock generators used to synchronize data communications circuits must meet stringent stability requirements. One such stability requirement calls for low jitter. Jitter is a high frequency phase variation in the clock.

Typically, the clock generator comprises a crystal resonator to generate an oscillation signal used as a clock. Because the frequency of the oscillation signal generated in the crystal resonator is limited to about 160 MHz, frequency multiplication of the oscillation signal is typically employed to generate clock frequencies above 160 MHz. However, frequency multiplication adds phase noise and distortion, which can result in undesired jitter in the clock.

Figure 1:
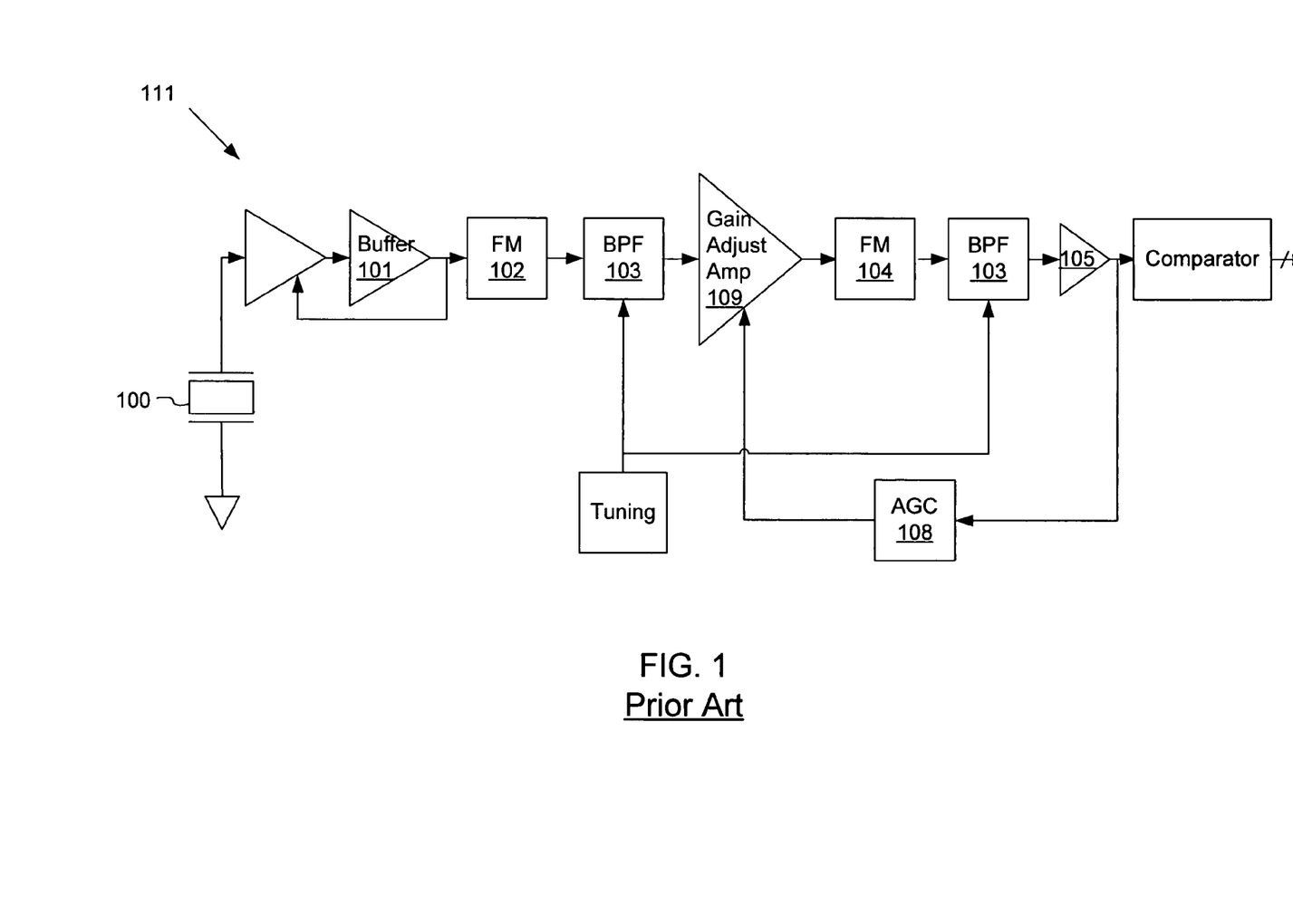
FIG. 1 illustrates a system for frequency multiplication of an oscillation signal in the prior art.

FIG. 1 illustrates a system 111 for frequency multiplication of an oscillation signal in the prior art. A buffer 101 amplifies the oscillation signal generated by the oscillator 100. Frequency multipliers 102 and 104 comprise radio frequency ("RF") "mixers" to convert the oscillation signal to higher frequencies. Band pass filters ("BPF") 103 reduce unwanted frequencies, and an amplifier 105 amplifies the higher frequencies. Automatic gain control ("AGC") 108 varies a gain adjustment amplifier 109 to control amplitude of signals in the frequency multiplier 104.

One problem with the system 111 for frequency multiplication is that noise and harmonics are amplified in the mixers comprising the frequency multipliers 102 and 104. Another problem is that the gain adjustment amplifier 109 adds noise that is further amplified in the frequency multiplier 104.

One approach to reduce noise and harmonics amplified in the mixers is by summing resulting frequencies from the mixers as described in U.S. Pat. No. 5,077,546 to Carfi et al. However, this approach is relatively expensive because of the many circuit components required. Furthermore, this approach is highly frequency selective and provides relatively poor performance.

Another circuit to reduce noise and harmonics includes 90-degree quadrature mixers, as described in U.S. Pat. No. 6,456,143 to Matsumoto et al. However, 90-degree quadrature mixers comprise more active elements than zero-degree mixers, creating unwanted noise and distortion. A further problem is that this circuit is highly frequency dependent, because 90-degree quadrature mixers operate optimally over a narrow frequency range. To utilize the circuit at a different oscillation frequency requires redesigning components of the circuit.

Figure 2:
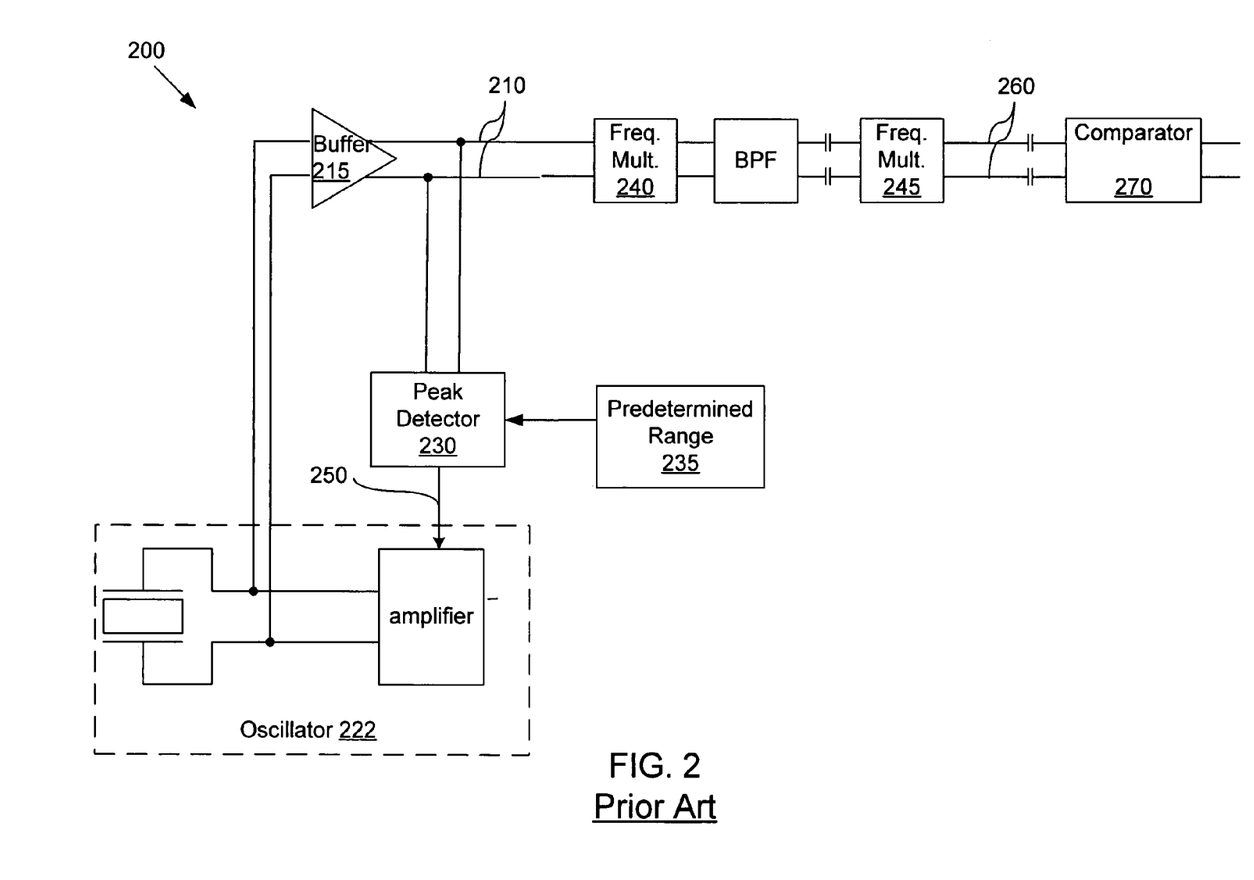
FIG. 2 illustrates a system to control an amplitude of an oscillation signal in the prior art.

A further approach to reducing noise and distortion amplified in the mixers is to control the amplitude of the oscillation signal. FIG. 2 illustrates a system 200 to control an amplitude of an oscillation signal in the prior art. The circuit 200 controls an amplitude of the oscillation signal at an input 210 of the frequency multiplier 240 to within a predetermined range 235. A peak detector 230 compares the input amplitude at the input 210 to the predetermined range 235. The peak detector 230 generates a control signal 250 based upon the comparison to control the amplitude of the oscillator 222. The predetermined range corresponds to a desired amplitude at the input 210 of the frequency multiplier 240, an input of the frequency multiplier 245, and/or an input 260 of the comparator 270.

The approach of FIG. 2 excites oscillation in the oscillator 222, minimizes phase noise or jitter in the oscillation signal at the input 210, and reduces the power consumed by the oscillator 222. However, one problem with the circuitry 200 of FIG. 2 is that the amplitude of the oscillation signal generated by the oscillator 222 is based upon only a predetermined range of amplitude. The amplitude of the oscillation signal is not based upon the actual amplitude of an input to a component following or "downstream" of the oscillator 222, such as the comparator 270. For example, the amplitude of the signal at the input 260 to the comparator 270 may be too high for the comparator 270 to operate optimally if the frequency multiplier 240 or the frequency multiplier 245 experience an increase in gain characteristics due to process variations, voltage fluctuations in a power supply (not shown) powering the circuitry 200, and/or a change in operating temperature of the circuitry 200.

With particular reference to clock generators for certain applications such as SONET and Fibre Channel, a very low jitter design is needed. However, prior art approaches to frequency multiplication of an oscillation signal do not give acceptable performance at low cost. Prior art oscillator designs do not provide good selectivity and low harmonic content such as is needed in a frequency multiplier approach.

Therefore, a need exists in industry to address the aforementioned deficiencies and inadequacies.

SUMMARY OF THE INVENTION

A circuit for generating an output oscillation signal with low jitter comprises an oscillator, a first frequency multiplier, a filter, a second frequency multiplier, a first feedback circuit, and a second feedback circuit. The oscillator generates an initial oscillation signal at an initial frequency based upon a control input to vary an amplitude of the initial oscillation signal. The first frequency multiplier multiplies the initial frequency of the initial oscillation signal to result in a first signal with first frequency and first undesired frequency components. The filter minimizes the first undesired frequency components of the first signal. The second frequency multiplier multiplies the first signal to result in the output oscillation signal with second frequency and second undesired frequency components. The second feedback circuit compares a predetermined range and at least one of the first signal and the output oscillation signal to result in a reference value. The first feedback circuit varies the control input based upon a comparison between the reference value and the amplitude of the initial oscillation signal to minimize the second undesired frequency components.

A method for generating the output oscillation signal with low jitter comprises generating the initial oscillation signal at the initial frequency based upon the control input to vary the amplitude of the initial oscillation signal. The initial frequency of the initial oscillation signal is multiplied to result in the first signal with first frequency and first undesired frequency components. The first signal is filtered to minimize the first undesired frequency components. The first signal is multiplied to result in the output oscillation signal with second frequency and second undesired frequency components. The reference value results from comparing the predetermined range and the amplitude of at least one of the first signal and the output oscillation signal. The control input is varied based upon the comparison between the reference value and the amplitude of the initial oscillation signal to minimize the second undesired frequency components.

By adjusting the amplitude of the initial oscillation signal based upon the output oscillation signal, the amplitude of the output oscillation signal is held constant even if changes occur in a gain of a signal path through the first frequency multiplier, the filter, and the second frequency multiplier. Small variations in the gain of the signal path caused by, for example, process variations, power supply voltage fluctuations, and/or change in operating temperature accumulate and result in large variation at the output oscillation signal. Regulating the amplitude of the initial oscillation signal with two feedback circuits maintains the amplitude of the output oscillation signal within the predetermined range. Therefore, the first frequency multiplier and the second frequency multiplier operate linearly, minimizing jitter. Furthermore, the variable reference value provides compensation for losses caused by external tuning capacitors or varactors (e.g., voltage-controlled crystal oscillator applications) due to tuning of the oscillator.

DETAILED DESCRIPTION OF THE INVENTION

The embodiments discussed herein are illustrative of one example of the present invention. As embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

Figure 3A:
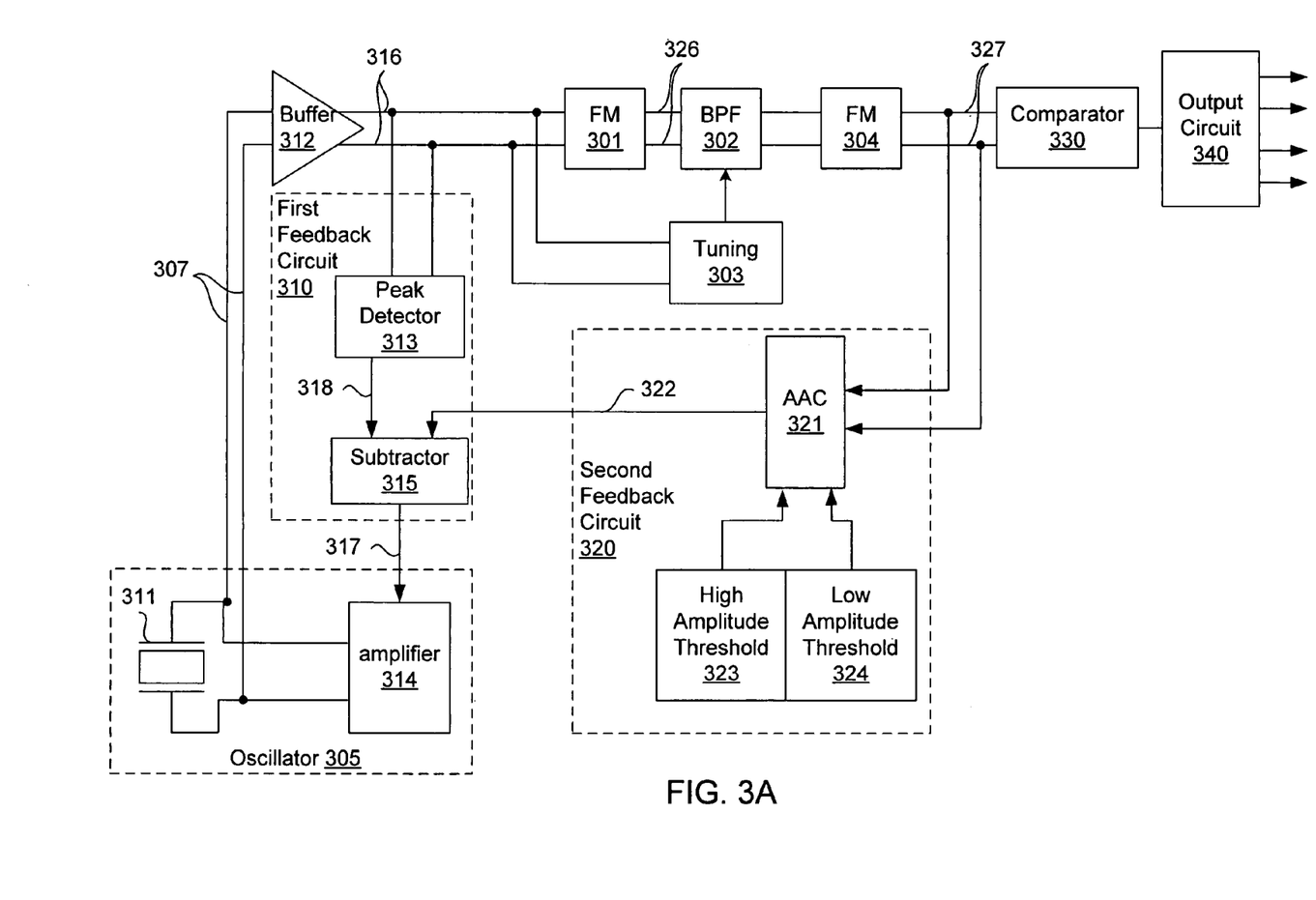
FIG. 3A illustrates a block diagram of a circuit for generating an output oscillation signal with low jitter in one embodiment of the invention.

FIG. 3A illustrates a block diagram of a circuit for generating an output oscillation signal with low jitter in one embodiment of the invention. An oscillator 305 comprises a resonator 311 and an amplifier 314 to generate an initial oscillation signal 307. The oscillator 305 generates the initial oscillation signal 307 at an initial frequency. The oscillator 305 includes a control input 317 to vary the amplitude of the initial oscillation signal 307. A buffer 312 amplifies the initial oscillation signal 307 to provide an input 316 to a frequency multiplier 301 at an input amplitude. The frequency multiplier 301 multiplies the initial frequency of the initial oscillation signal 307 to result in a first signal 326 with first frequency and first undesired frequency components. A bandpass filter ("BPF") 302 filters the first signal 326 to minimize the first undesired frequency components. A frequency multiplier 304 multiplies the filtered first signal to result in an output oscillation signal 327 with second frequency and second undesired frequency components. A comparator 330 converts the output oscillation signal 327 to a digital waveform. An output circuit 340 converts the digital waveform to multiple digital signal formats.

In one embodiment, the frequency multiplier 301 and the frequency multiplier 304 each comprise a zero-degree RF double-balanced mixer (not shown). The mixer includes two input ports (not shown). To double the initial frequency of the oscillation signal 307, the oscillation signal 307 is applied to both inputs ports of the mixer. As a result, the initial frequency (i.e., $f_0$) is suppressed at the output of the mixer, and only $2f_0$ results. The mixer is driven with equal amplitude levels with nominally zero phase difference at the two ports.

A tuning circuit 303 tunes the BPF 302 based upon the initial frequency. The BPF 302 selects the $2f_0$ frequency component of the first signal 326. The BPF 302 attenuates the first undesired frequency components. The BPF 302 also provides DC isolation and low frequency noise rejection to minimize close-in phase noise contribution. Close-in phase noise contributes to jitter in the output oscillation signal 327.

In some embodiments, further frequency multipliers (not shown) and BPFs 302 are incorporated between the frequency multiplier 301 and BPF 302, or between the frequency multiplier 304 and the comparator 330, to provide higher frequency multiples of the initial frequency. In one embodiment, the BPF 302 comprises a narrowband filter (not shown) for added selectivity, to improve spurious signal performance. In one embodiment, up to three BPFs 302 are cascaded for improved selectivity.

In one embodiment, the comparator 330 comprises a single-bit comparator, i.e., a zero-crossing detector (not shown) to convert the output oscillation signal 327 into a digital output signal. The duty cycle of the comparator 330 is in the range of 45-55% in some embodiments.

The output circuit 340 of the exemplary embodiment has two synchronous sections (not shown), each of which includes a programmable divider stage (not shown) and a mask-programmable output driver (not shown). In one embodiment, the output section includes divider circuits including divide-by-2 and divide-by-4, as well as synchronous outputs. The output section of this embodiment also provides for different digital signal formats, including low voltage differential signaling ("LVDS"), low voltage positive emitter coupled logic ("LVPECL"), and complimentary metal-oxide semiconductor ("CMOS") logic levels.

In the frequency multipliers 301 and 304 that may comprise RF mixers, phase noise is degraded at the rate of 20 log(m), where "m" is the multiplication factor (e.g., a frequency doubler degrades phase noise by about 6 dB, and a 10× multiplier degrades phase noise by about 20 dB). If harmonic content is input to a mixer, harmonics and sub-harmonics result at the output. For example, if input frequencies of $f_0+2f_0$ are input to the mixer that doubles the input frequency, rather than the desired result of only $2f_0$ at an output of the mixer, the output includes $n*f_0$ (i.e., $f_0$, $2f_0$, $3f_0$, etc.). Further frequency multiplication in successive mixers exacerbates this sub-harmonic problem.

Low jitter in the output oscillation signal 327 results from low phase noise, particularly in the oscillator 305, the frequency multipliers 301 and 304, and the comparator 330. Because the mixer amplifies any noise that is present in the input, it is desirable for the oscillator 305 to generate a very clean single frequency (i.e., ideally, a "tone") without noise or harmonic content. Sub-harmonic energy in particular results in poor phase noise and jitter performance in the output oscillation signal 327. Therefore, as described below, the amplitude of the initial oscillation signal 307 is controlled so that the frequency multipliers 301 and 304 output only the sum of the input frequencies (i.e., $2f_0$) and minimize the levels of the fundamental and harmonics other than $2f_0$. Minimizing the harmonic content out of the mixers reduces jitter in the output oscillation signal 327.

Further, for minimal phase shift or jitter in the embodiment of the comparator 303 comprising a zero-crossing detector, the amplitude of the output oscillation signal 327 should be within a predetermined range for an optimal balance between noise and distortion. If the amplitude of the output oscillation signal 327 is too low at the input to the comparator 330, then the comparator 330 generates jitter because of noise. If the amplitude of the output oscillation signal 327 is too high at the input to the comparator 330, then the comparator 330 generates jitter because of distortion.

Low phase noise in the exemplary circuit of FIG. 3A is achieved by two feedback circuits to control the amplitude of the initial oscillation signal 307 generated in the oscillator 305 to minimize noise and distortion in the frequency multipliers 301 and 304, and the comparator 330. By controlling the amplitude of the initial oscillation signal 307, the frequency multiplier 301 and the frequency multiplier 304 provide optimal mixing performance, and the comparator 330 provides optimal conversion performance.

A second feedback circuit 320 is any circuitry configured to compare the predetermined range and the first signal 326 and/or the output oscillation signal 327 to result in a reference value 322. The predetermined range comprises a low amplitude threshold 324 and a high amplitude threshold 323. One example of the second feedback circuit 320 comprises an automatic amplitude control ("AAC") 321 to generate the reference value 322. The reference value 322 is any value or signal indicating a comparison between the amplitude of the output oscillation signal 327 and the predetermined range. As described below in conjunction with FIG. 7, the reference value 322 of the exemplary embodiment comprises a four-bit digital word. In other embodiments, the reference value 322 is an analog signal.

A first feedback circuit 310 is any circuitry configured to vary the control input 317 of the oscillator 305 based upon a comparison between the reference value 322 and the amplitude of the initial oscillation signal 307. One example of the first feedback circuit 310 comprises a peak detector 313 and a subtractor 315. As described in detail below in conjunction with FIG. 6, the peak detector 313 of the exemplary embodiment converts the amplitude of the initial oscillation signal 307 into an input signal 318. As described in detail below in conjunction with FIG. 8, the subtractor 315 of the exemplary embodiment varies the control input 317 by converting the reference value 322 into a reference signal and comparing the input signal 318 and the reference signal.

Although the embodiment of FIG. 3A depicts the AAC 321 as generating the reference value 322 based upon the output oscillation signal 327, in some embodiments the AAC 321 generates the reference value 322 based upon the first signal 326 at the output of the frequency multiplier 301 or at the output of the BPF 302. In other embodiments, the AAC 321 generates the reference value 322 based upon the amplitude of outputs from other signal processing elements (not shown) following the frequency multiplier 301, the BPF 302, and/or the frequency multiplier 304. In some embodiments, the AAC 321 is configured to generate the reference value 322 based upon output amplitudes of multiple outputs from the frequency multiplier 301, the BPF 302, and/or the frequency multiplier 304.

Figure 3B:
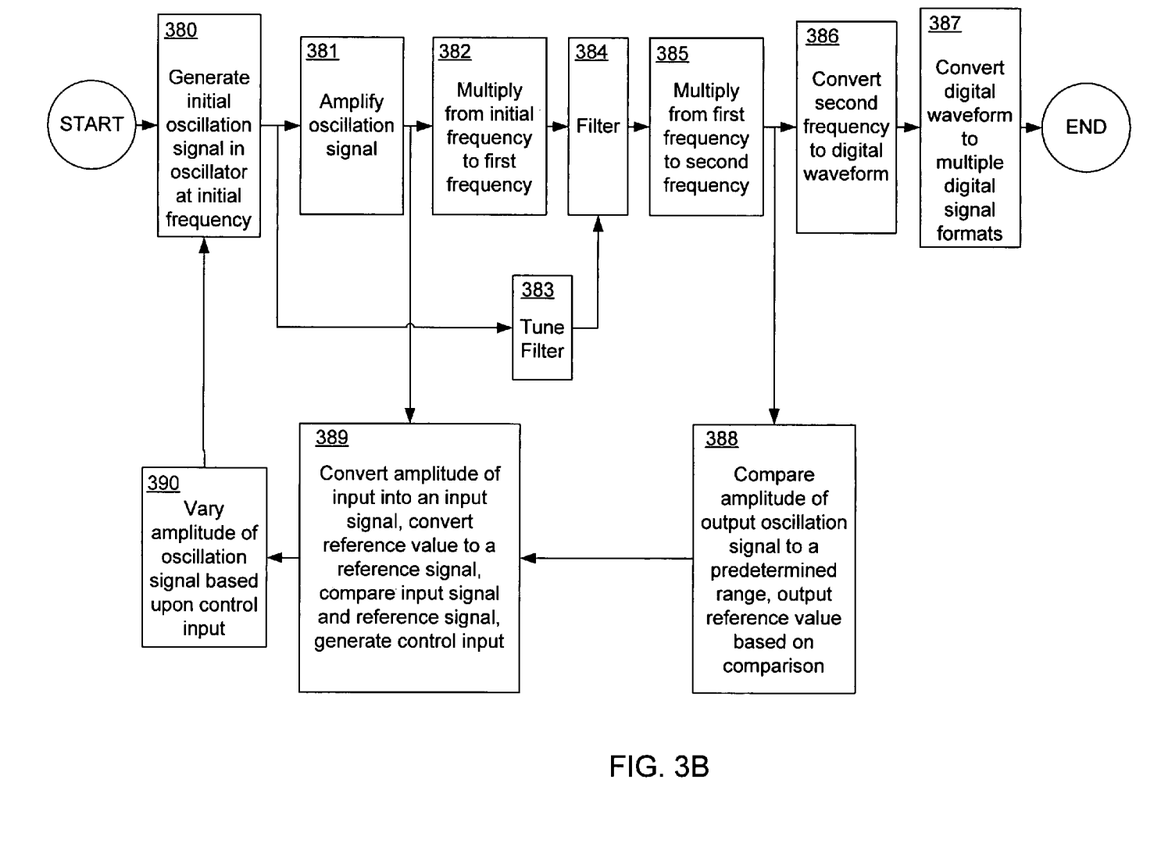
FIG. 3B illustrates an exemplary method for generating an output oscillation signal with low jitter in one embodiment of the invention.

FIG. 3B illustrates an exemplary method of generating an output oscillation signal with low jitter in one embodiment of the invention. At step 380, the oscillator 305 (FIG. 3A) generates the initial oscillation signal 307 (FIG. 3A) at the initial frequency. The oscillator 305 includes the control input 317 (FIG. 3A) to vary the amplitude of the initial oscillation signal 307. At step 381, the buffer 312 (FIG. 3A) amplifies the initial oscillation signal 307 to create the input 316 (FIG. 3A) at the input amplitude. At step 382, the frequency multiplier 301 (FIG. 3A) multiplies the initial frequency of the initial oscillation signal to result in the first signal 326 with first frequency and first undesired frequency components. At step 383, the tuning circuit 303 (FIG. 3A) tunes the BPF 302 based upon the initial frequency of the initial oscillation signal 317. At step 384, the BPF 302 (FIG. 3A) filters the first signal 326 to minimize the first undesired frequency components. At step 385, the frequency multiplier 304 (FIG. 3A) multiplies the filtered first signal to result in an output oscillation signal 327 (FIG. 3A) with second frequency and second undesired frequency components. At step 386, the comparator 330 (FIG. 3A) converts the output oscillation signal 327 to the digital waveform. At step 387, the output circuit 340 (FIG. 3A) converts the digital waveform to multiple digital signal formats.

In the feedback circuits of one embodiment, at step 388, the AAC 321 (FIG. 3A) of the second feedback circuit 320 (FIG. 3A) compares the amplitude of the output oscillation signal 327 to the predetermined range between the low amplitude threshold 324 (FIG. 3A) and the high amplitude threshold 323 (FIG. 3A). Also at step 388, the AAC 321 generates the reference value 322 (FIG. 3A) based upon the comparison. At step 389, the first feedback circuit 310 (FIG.

3A) varies the control input 317 of the oscillator 305 based upon the reference value 322 and the input amplitude of the input 316. The peak detector 313 of the exemplary embodiment converts the amplitude of the initial oscillation signal 307 into an input signal 318. The subtractor 315 of the exemplary embodiment varies the control input 317 by converting the reference value 322 into a reference signal and comparing the input signal 318 from the reference signal. At step 390, the amplifier 314 (FIG. 3A) varies the amplitude of the initial oscillation signal 307 generated in the oscillator 305 based upon the control input 317.

By adjusting the amplitude of the initial oscillation signal 307 based upon the amplitude of the output oscillation signal 327, the output oscillation signal 327 is held to a constant amplitude range even if changes occur in a gain of a signal path through the frequency multiplier 301, the BPF 302, and the frequency multiplier 304. Small variations in the gain of the signal path can accumulate and result in large variation at the output oscillation signal 327. For example, in one embodiment, the comparator 330 comprises a single-bit comparator, i.e., a zero-crossing detector (not shown) to convert the output oscillation signal 327 into a digital output signal. For optimal conversion performance with the least noise or jitter in the comparator 330 of this embodiment, the output amplitude of the output oscillation signal 327 should be in the predetermined range. The first feedback circuit 310 and the second feedback circuit 320 of this embodiment vary the control input 317 so that the amplitude of initial oscillation signal 307 results in the output amplitude of the output oscillation signal 327 in the predetermined range.

Another advantage is that the signal path comprises the minimum number of components, and only those components that are necessary for signal processing. Eliminating extraneous components from the signal path reduces the number of potential noise sources that can degrade the initial oscillation signal 307. As a result of providing AAC 321 feedback to the first feedback circuit 310, amplitude control is essentially "noiseless" as compared to an AGC 108 (FIG. 1) that requires a gain adjustment amplifier 109 (FIG. 1) in the signal path. Another benefit is that the variable reference value 322 provides compensation for losses caused by external crystal tuning capacitors or varactors (e.g., voltage-controlled crystal oscillator applications) due to tuning of the oscillator 305 as described below in conjunction with FIG. 4

Figure 4:
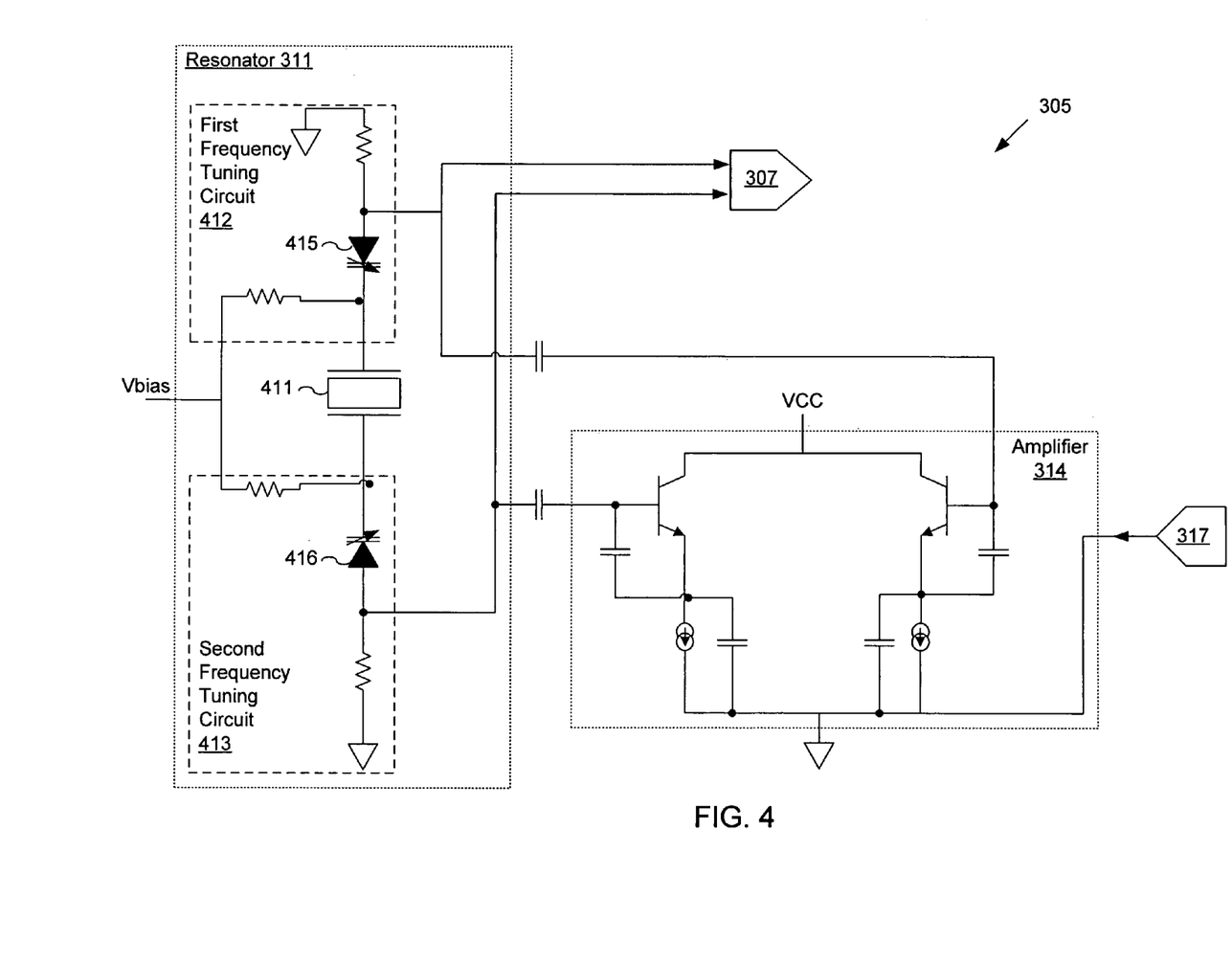
FIG. 4 illustrates a schematic drawing of the oscillator of FIG. 3A in one embodiment of the invention.

FIG. 4 illustrates a schematic drawing of the oscillator 305 of FIG. 3A in one embodiment of the invention. The oscillator 305 (FIG. 3A) of this embodiment comprises a resonator 311 (FIG. 3A) and an amplifier 314 (FIG. 3A). This embodiment of the oscillator 305 is detailed further in co-pending U.S. patent application Ser. No. 10/857,241, filed May 28, 2004, entitled "Systems and Methods for Tuning the Operating Frequency of a Crystal." The resonator 311 comprises a resonating element 411, a first frequency tuning circuit 412, and a second frequency tuning circuit 413. The resonating element 411 resonates at a natural frequency. Some examples of the resonating element 411 include a quartz crystal, an LC circuit, a surface-acoustic wave resonator, and a ceramic resonator. The first frequency tuning circuit 412 comprises a varactor 415. The second frequency tuning circuit 413 comprises a varactor 416. Some examples of the varactor 415 and the varactor 416 include a semiconductor diode varactor, a metal-oxide semiconductor capacitor ("MOSCAP"), and/or a switched-capacitor network. The first frequency tuning circuit 412 and the second frequency tuning circuit 413 each comprise a variable capacitance that "pull" the operating frequency of the resonating element 411 from the natural resonant frequency.

The amplifier 314 of the oscillator 305 comprises any circuitry to vary the amplitude of the initial oscillation signal 307 based upon the control input 317. In the embodiment illustrated in FIG. 4, the amplifier 314 comprises two bipolar transconductance amplifiers operating 180 degrees out of phase to generate, in conjunction with the resonator 311, a tunable initial oscillation signal 307 that is differential with respect to ground. In other embodiments, the amplifier 314 includes metal-oxide semiconductor ("MOS") transistor circuitry (not shown) and/or operational amplifier ("opamp") circuitry (not shown) in place of bipolar transistor circuitry. In alternative embodiments, the oscillator 305 comprises a single feedback amplifier (not shown) to produce a single-ended initial oscillation signal 307 in conjunction with the resonator 311.

In the exemplary embodiment of FIG. 4 utilizing a quartz crystal resonating element 411 for optimal phase noise performance in the signal path and the comparator 330 (FIG. 3A), the feedback from the amplifier 314 to the quartz crystal resonating element 411 is maintained at less than 1 milliwatt. However, due to wide variance in crystal parameters such as "Reff" for different quartz crystal resonating elements 411, the control input 317 allows for the optimization of the resonator 311 and the amplifier 314 for minimum noise generation in the initial oscillation signal 307. Controlling the control input 317 to change the amplitude of the initial oscillation signal 307 has only a small impact on noise in the initial oscillation signal 307.

Figure 5:
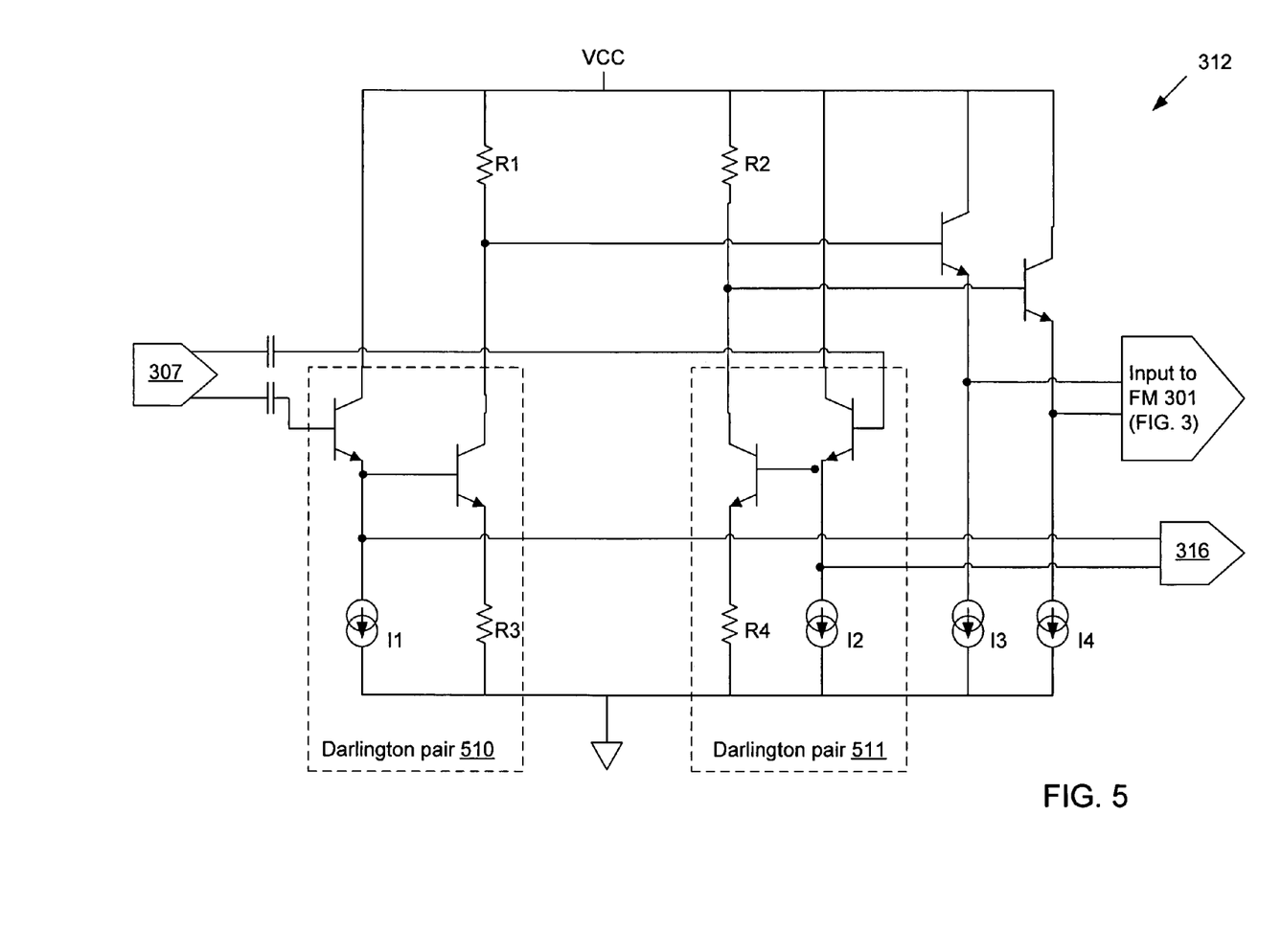
FIG. 5 illustrates a schematic drawing of the buffer of FIG. 3A in one embodiment of the invention.

FIG. 5 illustrates a schematic drawing of the buffer 312 of FIG. 3A in one embodiment of the invention. The buffer 312 of this embodiment is in parallel with the resonator 311 (FIG. 3A), and comprises a first Darlington pair 510 and a second Darlington pair 511 to present a high impedance load to the resonator 311. The high impedance load prevents degradation of the initial oscillation signal 307 (FIG. 3A). In the exemplary embodiment, resistor R1 and resistor R2 are each 100 ohms, resistor R3 and resistor R4 are each 150 ohms, current I1 and current I2 are each 500 microamps, and current I3 and current I4 are each 2 milliamps.

Figure 6:
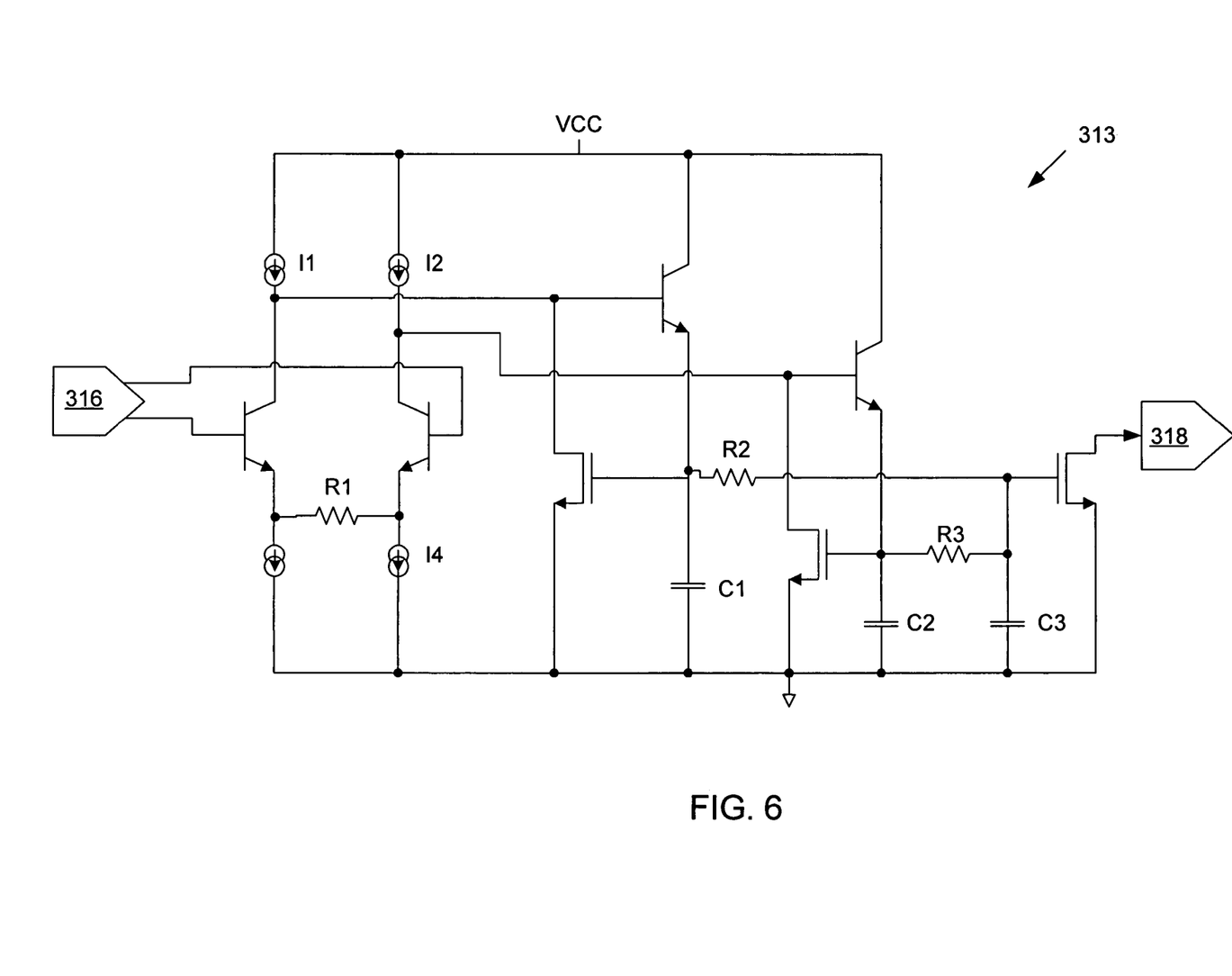
FIG. 6 illustrates a schematic drawing of the peak detector of FIG. 3A in one embodiment of the invention.

FIG. 6 illustrates a schematic drawing of the peak detector 313 of FIG. 3A in one embodiment of the invention. The peak detector 313 is any circuitry to convert the input amplitude of the input 316 (FIG. 3A) into an input signal 318 (FIG. 3A). In the embodiment of FIG. 6, the input signal 318 comprises an input current. In this embodiment, current I1 and current I2 are each 200 microamps, current I3 and current I4 are each 100 microamps, resistor R1 is 10 kilohms, resistor R2 and resistor R3 are each 3 kilohms, capacitor C1 and capacitor C2 are 5 picofarad, and capacitor C3 is 30 picofarad. As will be appreciated by a skilled artisan, an alternative embodiment of the peak detector 313 comprises MOS transistor circuitry (not shown) and/or opamp circuitry (not shown) in place of bipolar transistor circuitry convert the input amplitude at the input 316 into the input voltage signal for the input signal 318.

Figure 7:
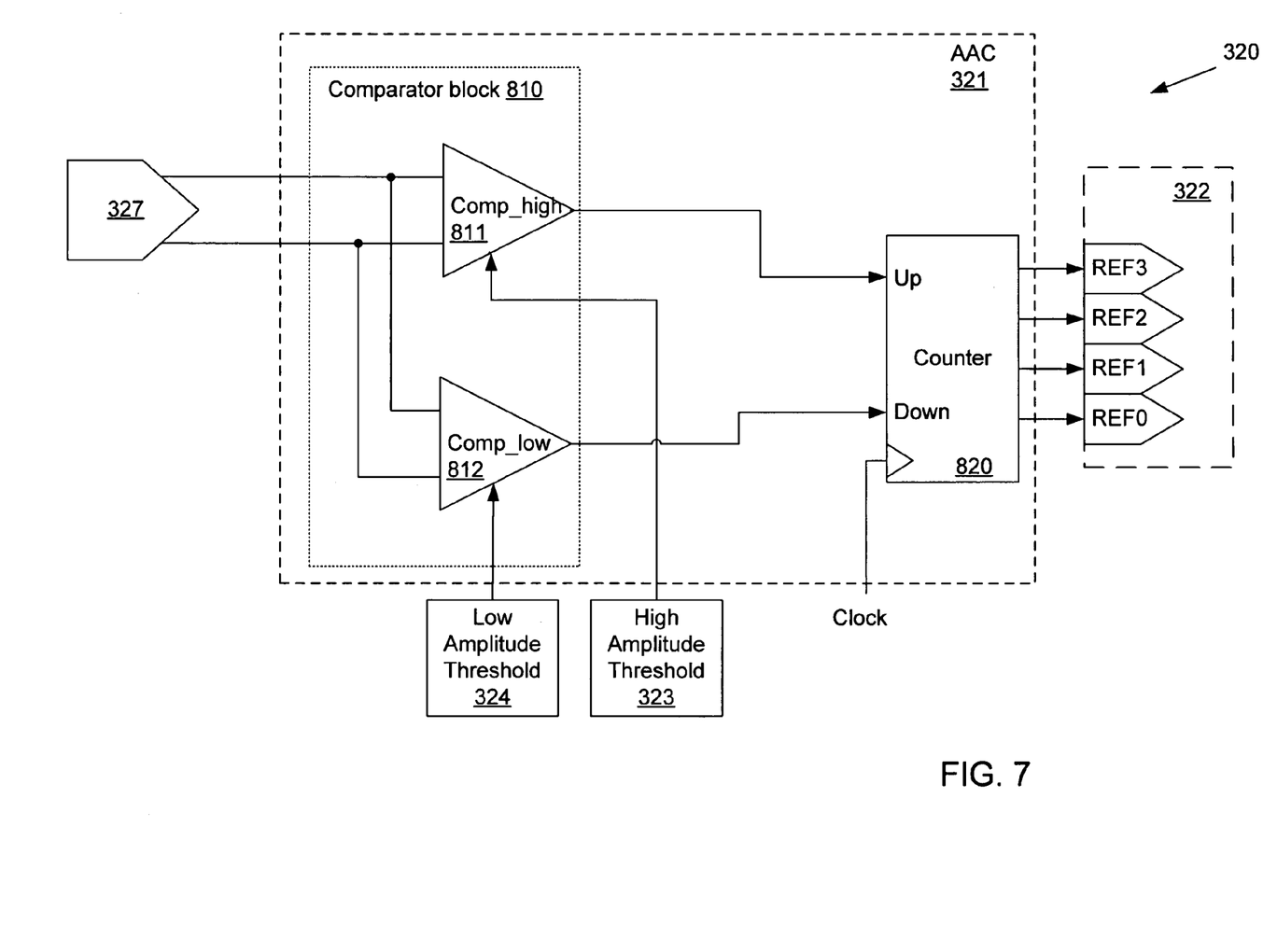
FIG. 7 illustrates a block diagram of the second feedback circuit of FIG. 3A in one embodiment of the invention.

FIG. 7 illustrates a block diagram of the second feedback circuit 320 of FIG. 3A in one embodiment of the invention. The AAC 321 comprises a comparator block 810 and an up/down counter 820 to generate the reference value 322 (FIG. 3A). The reference value 322 of this embodiment comprises a 4-bit digital word. In alternative embodiments, the reference value 322 comprises an analog signal. The comparator block 810 of the AAC 321 compares the output amplitude of the output oscillation signal 327 (FIG. 3A) with the predetermined range. If the output amplitude of the output oscillation signal 327 is higher than the high amplitude threshold 323, a comp_high comparator 811 in the comparator block 810 outputs a digital "1" and the up/down counter 820 decrements the reference value 322 with each clock pulse. As will be appreciated with respect to the embodiment of the subtractor 315 of FIG. 8 below, decrementing the reference value 322 will lower the output amplitude of the output oscillation signal 327. If the output amplitude of the output oscillation signal 327 is lower than the low amplitude threshold 324, a comp_low comparator 812 in the comparator block 810 outputs a digital "1" and the up/down counter 820 increments the reference value 322 with each clock pulse. As will be appreciated with respect to the embodiment of the subtractor 315 of FIG. 8 below, incrementing the reference value 322 will raise the output amplitude of the output oscillation signal 327. If the output amplitude of the output oscillation signal 327 is between the high amplitude threshold 323 and the low amplitude threshold 324, the comp_high comparator 811 and the comp_low comparator 812 output a digital "0", preventing the up/down counter 820 from changing the reference value 322. In one embodiment, the high amplitude threshold 323 comprises a pull-up resistor (not shown), and the low amplitude threshold 324 comprises a pull-down resistor (not shown). In other embodiments, the high amplitude threshold 323 and the low amplitude threshold 324 each comprise voltage dividers, programmable values, and/or input signals.

Figure 8:
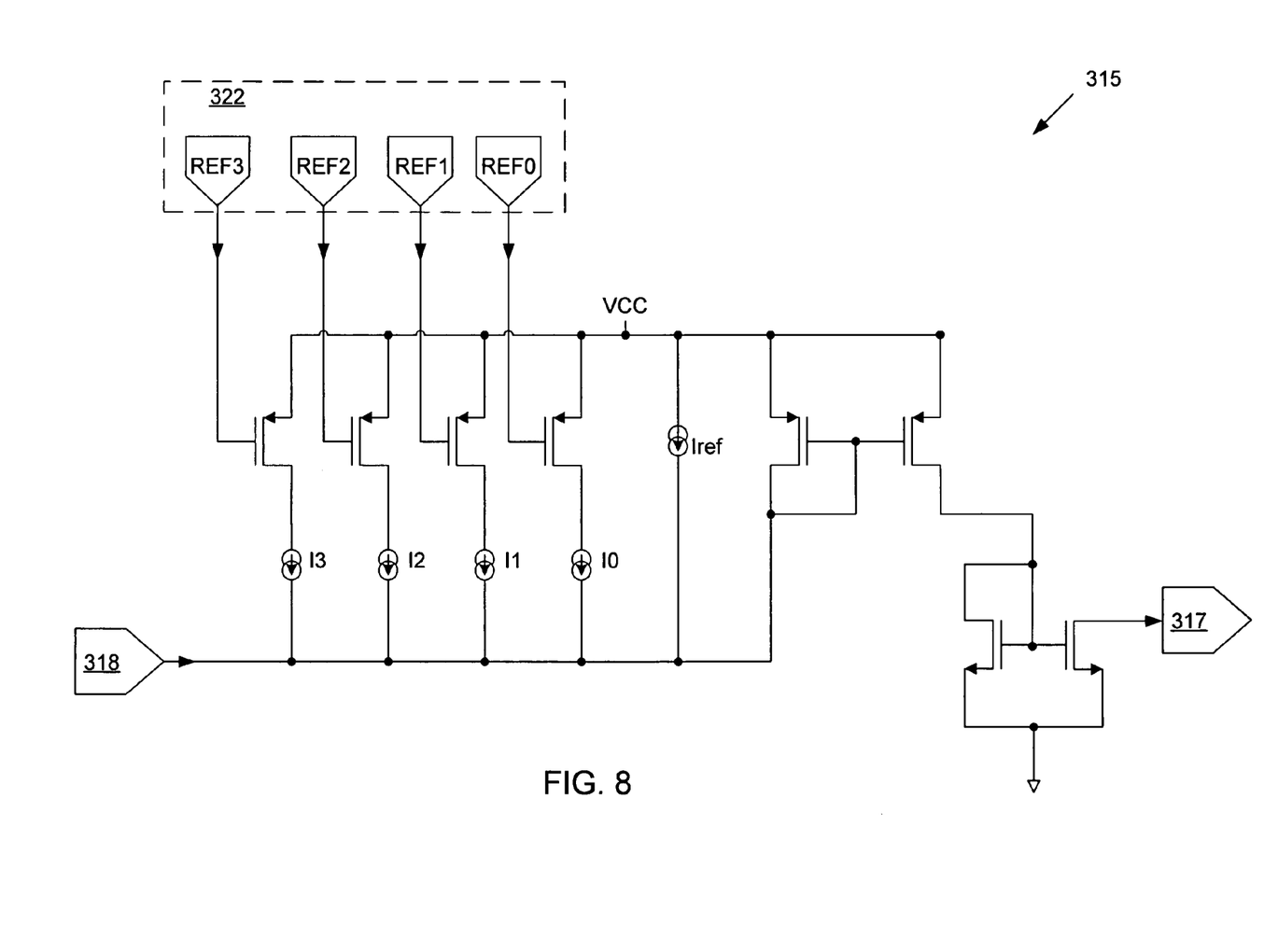
FIG. 8 illustrates a schematic drawing of the subtractor of FIG. 3A in one embodiment of the invention.

FIG. 8 illustrates a schematic drawing of the subtractor 315 of FIG. 3A in one embodiment of the invention. The subtractor 315 is any circuitry to convert the reference value 322 (FIG. 3A) from the AAC 321 (FIG. 3A) into a reference signal, and to compare the input signal 318 (FIG. 3A) from the peak detector 313 to the reference signal so as to generate the control input 317 (FIG. 3A). The resulting control input 317 controls the amplitude of oscillation signal 307 (FIG. 3A) generated in the oscillator 305 (FIG. 3A). It will be appreciated that the circuit of FIG. 8 converts the reference value 322 into a reference current and subtracts the input current of the input signal 318 from the reference current. An alternative embodiment of the subtractor 315 includes MOS transistor circuitry (not shown) and/or opamp circuitry (not shown) in place of bipolar transistor circuitry to convert the reference value 322 (FIG. 3A) to a reference voltage for the reference signal and to compare the input signal 318 from the peak detector 313 to the reference signal.

It will be appreciated that the embodiments of FIGS. 4-8 comprise negative feedback between the output amplitude of the output 327 and the amplitude of the oscillation signal 307. In the first feedback circuit 310, a decrease in the reference value 322 results in a decrease in the amplitude of the oscillation signal 307. In the second feedback circuit 320, an increase in the output amplitude of the output 327 above the predetermined threshold (e.g., due to power supply voltage fluctuation) results in a decrease in the reference value 322. The decrease in the reference value 322 results in a decrease in the amplitude of the oscillation signal 307 and a corresponding decrease in the output amplitude of the output 327. Conversely, a decrease in the output amplitude of the output 327 below the predetermined threshold results in an increase in the reference value 322, an increase in the amplitude of the oscillation signal 307, and a corresponding increase in the output amplitude of the output 327.

The invention has been described above with reference to specific embodiments. Persons skilled in the art, however, will understand that various modifications and changes may be made thereto without departing from the broader spirit and scope of the invention as set forth in the appended claims.

What is claimed is:

1. A circuit for generating an output oscillation signal with low jitter, the circuit comprising:
   an oscillator configured to generate an initial oscillation signal at an initial frequency, the oscillator having a control input to vary an amplitude of the initial oscillation signal;
   a first frequency multiplier configured to multiply the initial frequency of the initial oscillation signal to result in a first signal with first frequency and first undesired frequency components;
   a filter configured to minimize the first undesired frequency components of the first signal;
   a second frequency multiplier configured to multiply the first signal to result in the output oscillation signal with second frequency and second undesired frequency components;
   a second feedback circuit configured to compare a predetermined range and at least one of the first signal and the output oscillation signal to result in a reference value; and
   a first feedback circuit configured to vary the control input based upon a comparison between the reference value and the amplitude of the initial oscillation signal to minimize the second undesired frequency components.

2. The circuit of claim 1, wherein the oscillator comprises a quartz crystal.

3. The circuit of claim 1, wherein the oscillator comprises a surface-acoustic wave resonator.

4. The circuit of claim 1, wherein the oscillator comprises a ceramic resonator.

5. The circuit of claim 1, wherein the oscillator comprises an inductor-capacitor resonator.

6. The circuit of claim 1, wherein the predetermined range comprises a high amplitude threshold and a low amplitude threshold.

7. The circuit of claim 1, wherein the first feedback circuit comprises:
   a peak detector configured to convert the amplitude of the initial oscillation signal to an input signal; and
   a subtractor configured to vary the control input by converting the reference value into a reference signal and comparing the input signal and the reference signal.

8. The circuit of claim 1, wherein the first feedback circuit comprises:
   a peak detector configured to convert the amplitude of the initial oscillation signal to an input current; and
   a subtractor configured to vary the control input by converting the reference value into a reference current and subtracting the input current from the reference current.

9. The circuit of claim 1, wherein the reference value comprises a digital word.

10. The circuit of claim 1, further comprising at least one amplifier to vary the amplitude of the oscillation signal based upon the control input.

11. The circuit of claim 10, wherein the at least one amplifier comprises at least one transconductance amplifier.

12. The circuit of claim 1, further comprising a comparator configured to convert the output oscillation signal to a digital waveform.

13. The circuit of claim 12, further comprising an output circuit configured to convert the digital waveform to multiple digital signal formats.

14. The circuit of claim 1, further comprising a tuning circuit configured to tune the filter based upon the initial frequency.

15. The circuit of claim 1, further comprising a buffer configured to amplify the initial oscillation signal.

16. The circuit of claim 1, further comprising a tuning circuit configured to tune the initial frequency of the initial oscillation signal.

17. The circuit of claim 16, wherein the tuning circuit comprises at least one varactor.

18. A method for generating an output oscillation signal with low jitter, the method comprising:
generating an initial oscillation signal at an initial frequency based upon a control input to vary an amplitude of the initial oscillation signal;
multiplying the initial frequency of the initial oscillation signal to result in a first signal with first frequency and first undesired frequency components;
filtering the first signal to minimize the first undesired frequency components;
multiplying the first signal to result in the output oscillation signal with second frequency and second undesired frequency components;
comparing a predetermined range and an amplitude of at least one of the first signal and the output oscillation signal to result in a reference value; and
varying the control input based upon a comparison between the reference value and the amplitude of the initial oscillation signal to minimize the second undesired frequency components.

19. The method of claim 18, wherein varying the control input comprises:
converting the amplitude of the initial oscillation signal into an input signal;
converting the reference value into a reference signal; and
comparing the input signal and the reference signal.

20. The method of claim 18, wherein at least one amplifier receives the control input to vary the amplitude of the oscillation signal.

21. The method of claim 20, wherein the at least one amplifier comprises at least one transconductance amplifier.

22. The method of claim 18, wherein varying the control input comprises:
converting the amplitude of the initial oscillation signal into an input current;
converting the reference value into a reference current; and
subtracting the input current from the reference current.

23. The method of claim 18, further comprising amplifying the initial oscillation signal.

24. The method of claim 18, wherein filtering to minimize the first undesired frequency components is based upon the initial frequency.

25. The method of claim 18, further comprising converting the output oscillation signal to a digital waveform.

26. The method of claim 25, further comprising converting the digital waveform to multiple digital signal formats.

27. The method of claim 18, wherein the predetermined range comprises a high amplitude threshold and a low amplitude threshold.

28. The method of claim 18, wherein the reference value comprises a digital word.

* * * * *